(12) United States Patent
Huang

(10) Patent No.: US 11,815,546 B2
(45) Date of Patent: Nov. 14, 2023

(54) FIXING DEVICE AND FIXING METHOD FOR FIXING CHIP IN TWO ORTHOGONAL DIRECTIONS WITHIN HORIZONTAL PLANE AND CHIP TESTER

(71) Applicant: CHANGXIN MEMORY TECHNOLOGIES, INC., Hefei (CN)

(72) Inventor: Jinrong Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/451,184

(22) Filed: Oct. 18, 2021

(65) Prior Publication Data

US 2023/0003789 A1    Jan. 5, 2023

Related U.S. Application Data

(63) Continuation of application No. PCT/CN2021/109971, filed on Aug. 2, 2021.

(30) Foreign Application Priority Data

Jul. 1, 2021 (CN) .......................... 202110744384.8

(51) Int. Cl.
 *G01R 31/28*    (2006.01)
(52) U.S. Cl.
 CPC ................. *G01R 31/2851* (2013.01)
(58) Field of Classification Search
 CPC ............. G01R 1/0466; G01R 1/0483; G01R 31/2851; G01R 31/2865; G01R 31/2887;
 (Continued)

(56) References Cited

U.S. PATENT DOCUMENTS

| 5,006,792 A * | 4/1991 | Malhi ................ G01R 1/06727 |
| | | 257/691 |
| 5,568,057 A | 10/1996 | Kim et al. |
| 6,456,100 B1 | 9/2002 | Hembree et al. |
| 6,861,857 B2 * | 3/2005 | Moushon ............. G01R 1/0466 |
| | | 324/750.25 |

(Continued)

FOREIGN PATENT DOCUMENTS

| CN | 201622288 U | 11/2010 |
| CN | 207096284 U | 3/2018 |
| CN | 209583998 U | 11/2019 |
| CN | 210037887 U | 2/2020 |

(Continued)

OTHER PUBLICATIONS

International Search Report as cited in PCT Application No. PCT/CN2021/109971 dated Mar. 11, 2022, 11 pages.

*Primary Examiner* — Vinh P Nguyen
(74) *Attorney, Agent, or Firm* — Cooper Legal Group, LLC

(57) ABSTRACT

Embodiments of the present application disclose a fixing device and fixing method for chip test and a chip tester. The fixing device for chip test includes: a carrier with a fixing chamber for fixing a chip formed inside, a plurality of adjustors being disposed on sidewalls of the fixing chamber and configured to be extended or retracted to adjust a position of the chip in two orthogonal directions within a horizontal plane; and a top cover configured to cooperate with the carrier to fix the chip in a vertical direction, wherein at least one adjustable pressing cover is disposed at a bottom of the top cover, so as to autonomously adjust a pressing force applied to the chip by the pressing cover in the vertical direction. The present application is suitable for fixing chips with various overall dimensions, and can adaptively adjust a pressing force.

20 Claims, 5 Drawing Sheets

(58) Field of Classification Search
CPC ............ G01R 31/2891; G01R 31/2886; G01R 31/2893; G01R 31/2863; G01R 31/26; G01R 1/0408; G01R 1/0433; G01R 31/01; G01R 31/2884; G01R 1/0735; G01R 1/07378; G01R 1/04; G01R 31/28; G01R 1/06716; G01R 1/0416; G01R 31/311; G01R 1/06705; G01R 31/2808; G01R 31/2862; G01R 31/303; G01R 31/307; H01R 12/714; H01R 12/52; H01R 2201/20; H01R 13/2421; H01R 12/89; H01R 13/24; H01R 13/639; H01R 13/2414; H01R 33/76; H01R 27/00; H01R 12/57; H01R 12/523; H01R 12/85; H01R 12/716; H01L 2924/14; H01L 23/32

See application file for complete search history.

(56) References Cited

U.S. PATENT DOCUMENTS

| | | | | |
|---|---|---|---|---|
| 8,143,909 | B2* | 3/2012 | Ryu | G01R 1/0483 |
| | | | | 324/750.16 |
| 8,221,135 | B2* | 7/2012 | Chang | H05K 7/1053 |
| | | | | 439/71 |
| 9,653,230 | B1* | 5/2017 | Vaughn | G01R 1/0466 |
| 9,835,650 | B2* | 12/2017 | Palaniappa | G01R 1/0466 |
| 10,495,688 | B1* | 12/2019 | Lopez | G01R 31/2891 |
| 2001/0012725 | A1 | 8/2001 | Maeda et al. | |
| 2002/0140444 | A1 | 10/2002 | Haseyama et al. | |
| 2016/0231355 | A1 | 8/2016 | Jang | |

FOREIGN PATENT DOCUMENTS

| | | |
|---|---|---|
| CN | 212410778 U | 1/2021 |
| CN | 115561615 A | 1/2023 |
| JP | H09139270 A | 5/1997 |

\* cited by examiner

FIXING DEVICE AND FIXING METHOD FOR FIXING CHIP IN TWO ORTHOGONAL DIRECTIONS WITHIN HORIZONTAL PLANE AND CHIP TESTER

CROSS-REFERENCE TO RELATED APPLICATIONS

The present application is a continuation application of International Patent Application No. PCT/CN2021/109971, filed on Aug. 2, 2021, which claims priority to Chinese Patent Application No. 202110744384.8, entitled "FIXING DEVICE AND FIXING METHOD FOR CHIP TEST AND CHIP TESTER" and filed on Jul. 1, 2021. International Patent Application No. PCT/CN2021/109971 and Chinese Patent Application No. 202110744384.8 are incorporated into the present application by reference in their entireties.

TECHNICAL FIELD

The present application relates to the field of semiconductor tester technologies, and in particular, to a fixing device and fixing method for chip test and a chip tester.

BACKGROUND

In the field of semiconductor production, main links include wafer manufacturing and package test. Two test steps, i.e. wafer inspection and function test (FT), are required to be carried out respectively in these two links. When various function indexes of a chip are tested in these two steps, it is required to connect the chip into a test circuit. Therefore, a fixing system or device for the chip is needed, so that pins of the chip can be in stable contact with the test circuit and, in particular, it can be ensured that the chip can be in good contact with needles of the test circuit in a vertical direction. Since overall package dimensions of various types of chips are different, if a fixing device is customized for each overall package dimension of chips, costs will be greatly increased. Therefore, a fixing device which can customize adjusted dimensions is needed.

With the large-scale popularization of BGA (Ball Grid Array Package), BGA-based chips have been widely adopted. Solder balls are used in BGA chips instead of pins. Because the solder balls will expand during a high-temperature test, if a fixing device for chips is unable to adaptively adjust a fixing position according to an expansion stress of the solder balls, the solder balls will be forcibly pressed to deform, and as a result, other tests will be affected. A technical solution in a prior art is still unable to solve the technical problem on how to fix a chip when solder balls are deformed in a high-temperature test.

SUMMARY

Embodiments of the present application can accurately position and fix a to-be-tested chip in a horizontal direction and a vertical direction respectively, be applied to chips with different sizes and thicknesses and at least prevent solder balls on the chip from being damaged.

According to some embodiments, a first aspect of the present application provides a fixing device for chip test, which includes: a carrier with a fixing chamber for fixing a to-be-tested chip formed inside, a plurality of adjustors being disposed on sidewalls of the fixing chamber and configured to be extended or retracted to adjust a position of the to-be-tested chip in two orthogonal directions within a horizontal plane; and a top cover configured to cooperate with the carrier to fix the to-be-tested chip in a vertical direction, wherein at least one adjustable pressing cover is disposed at a lower end of the top cover, so as to autonomously adjust a pressing force applied to the to-be-tested chip by the pressing cover in the vertical direction.

According to some embodiments, a second aspect of the present application provides a chip tester adopting the fixing device for chip test according to the first aspect, including: a test board, a test circuit including needles being disposed on the test board; and the fixing device for chip test fixing a to-be-tested chip on an upper surface of the test circuit, so that solder balls of the to-be-tested chip are in contact with the needles.

According to some embodiments, a third aspect of the present application provides a fixing method for chip test adopting the fixing device for chip test according to the first aspect, including the following steps: (Step S1) adjusting each adjustor 3 to a maximum scale position; (Step S2) determining adjusting travels of the adjustors 3 in an X direction and a Y direction according to a size of a to-be-tested chip and scale information; (Step S3) putting the to-be-tested chip into the fixing chamber 2 of the carrier 1; (Step S4) adjusting the adjustors 3 to predetermined positions according to the determined adjusting travels to fix the to-be-tested chip in a horizontal direction; (Step S5) placing the top cover 4 onto the carrier 1, so that the pressing cover 5 presses the to-be-tested chip to fix the to-be-tested chip in a vertical direction.

BRIEF DESCRIPTION OF DRAWINGS

In order to more clearly illustrate the technical solutions in embodiments of the present application or a prior art, the accompanying drawings required to be used in the description of the embodiments will be briefly introduced below. Apparently, the accompanying drawings in the following description only show some embodiments of the present application, and those of ordinary skill in the art can still derive other drawings from these accompanying drawings without creative efforts.

Figure 1:
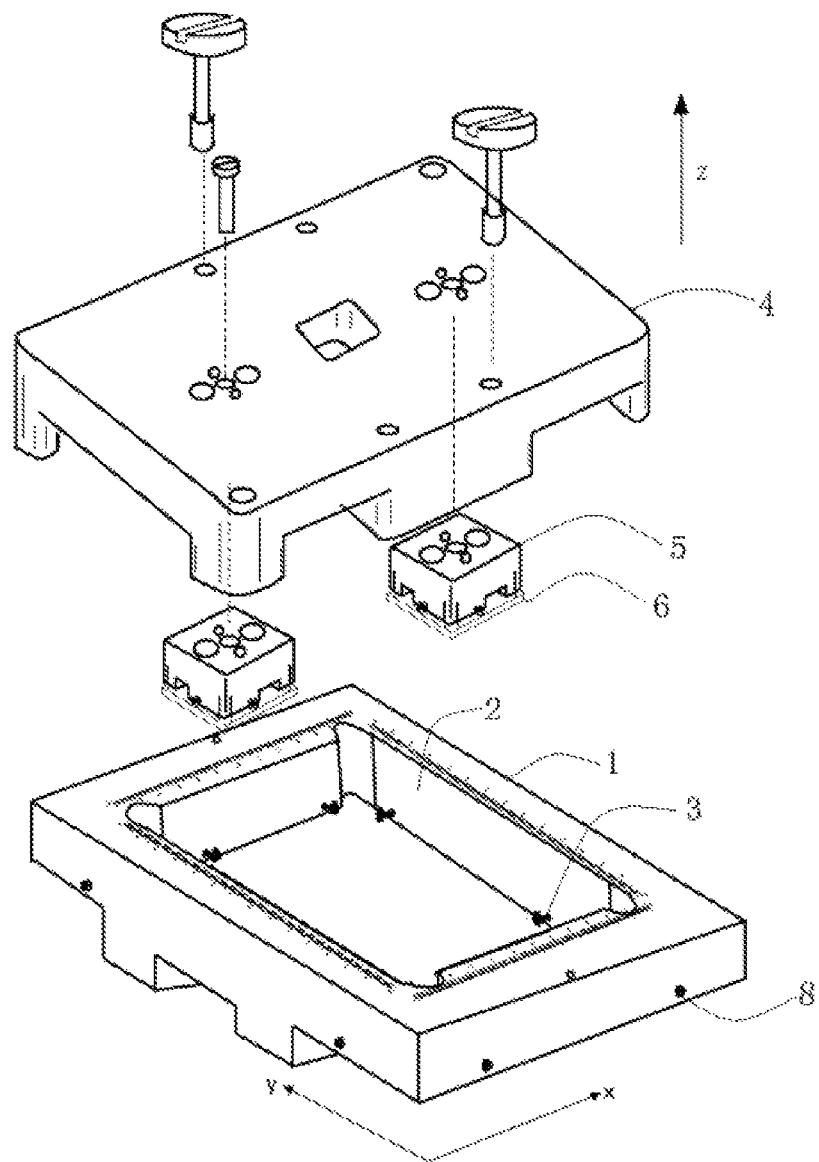
FIG. 1 is a schematic diagram of a fixing device for chip test according to an embodiment of the present application.

Reference numerals:

1: carrier; 2: fixing chamber; 3: adjustor; 3-1: adjusting plate; 4: top cover; 5: pressing cover; 6: spacer; 7: elastic body; 8: adjusting knob; 9: pin; 30: to-be-tested chip; 300: test board.

DESCRIPTION OF EMBODIMENTS

In order to make the object, technical solution and advantages of the present application clearer, the present application will be further described in detail below in conjunction with specific embodiments and with reference to the accompanying drawings. It should be understood that these descriptions are merely exemplary rather than intended to limit the scope of the present application. In addition, descriptions of well-known structures and technologies are omitted in the following description in order to avoid the unnecessary confusion of the concept of the present application.

Schematic diagrams of layer structures according to embodiments of the present application are shown in the accompanying drawings. These drawings are not drawn to scale. For the sake of clarity, some details are amplified, and some details may be omitted. The shapes of various regions and layers and the relative size and position relationships between them shown in the drawings are merely exemplary, and may have errors to some extent in practice due to manufacturing tolerances or technical limitations, and those skilled in the art can additionally design regions/layers with different shapes, sizes and relative positions.

Apparently, the embodiments described are part of the embodiments of the present application rather than all the embodiments. All other embodiments which are obtained by those of ordinary skill in the art based on the embodiments in the present application without creative efforts shall fall within the protection scope of the present application. The present application will be described in more detail below with reference to the accompanying drawings. In every accompanying drawing, the identical elements are represented by the similar reference numerals. For clarity, each portion in the accompanying drawings is not drawn to scale.

The purpose of a fixing device for chip test is to fix a position of a chip from three spatial dimensions to fix the chip in a test circuit and, by setting and adjusting fixed dimensions in the three spatial dimensions, support chips with various overall package dimensions. One the one hand, the fixing device for chip test according to an embodiment of the present application can fix chips with different packages and different numbers of solder balls or with an equal number of solder balls but different overall package dimensions in a horizontal fixing direction by means of a carrier for devices with different dimensional specifications, avoiding resource waste and a complex test process, which is favorable for the reduction of cost. On the other hand, in a vertical fixing direction, a pressing cover for fixing the carrier according to the embodiment of the present application has an autonomously adjustable space. During a high-temperature test, solder balls will expand or soften, and the pressing cover capable of autonomously adjusting a pressing force can prevent the solder balls from being in excessive contact with needles to deform, so that other tests will not be affected and it can be ensured that the solder balls will not be injured. Moreover, when chips with different thicknesses are tested based on the fixing device for chip test according to the embodiment of the present application, not only can adjustment be performed by increasing or decreasing a spacer number of the pressing cover, but also operation is simple and test cost is low. In addition, the fixing device for chip test and a chip tester according to the embodiments of the present application avoid the use of an overhead cross-beam structure in dimensional adjustment. Therefore, a pressing function of the pressing cover on a chip will not be severely affected, and thereby, the problem of contact between solder balls and the needles of the test circuit during a test can be avoided.

FIG. 1 is a schematic diagram of a fixing device for chip test according to an embodiment of the present application.

As shown in FIG. 1, the fixing device for chip test according to the embodiment of the present application mainly includes a carrier 1 for fixing a chip in a horizontal direction and a top cover 4 for fixing the chip in a vertical direction. The to-be-tested chip is accurately and reliably fixed in the horizontal and vertical directions through the cooperation between the carrier 1 and the top cover 4, ensuring that a plurality of solder balls on the to-be-tested chip can be in accurate contact with a plurality of needles of a test circuit, without damaging the to-be-tested chip.

A fixing chamber 2 for accommodating and fixing the chip is formed in the carrier 1 according to the embodiment of the present application, and a plurality of adjustors 3 are disposed on sidewalls of the fixing chamber 2 and configured to be extended or retracted to adjust a position of the chip in two orthogonal directions in the horizontal plane. The adjustors 3 are distributed in the two orthogonal directions (the X and Y directions in FIG. 1) in the horizontal direction, and are arranged to be extended or retracted for adjustment along the X and Y directions respectively, thus positioning and fixing the to-be-tested chip in the horizontal direction. Since the adjustors 3 can be extended or retracted for adjustment along the X and Y directions, chips with different overall package dimensions can be fixed in the fixing chamber 2.

The top cover 4 according to the embodiment of the present application is configured to cooperate with the carrier 1 to fix the chip in the vertical direction (the Z direction in FIG. 1). At least one adjustable pressing cover 5 is disposed at the lower end of the top cover 4, and is configured to autonomously adjust a pressing force applied to the chip by the pressing cover 5 in the vertical direction. The pressing cover 5 is detachably fixed to the top cover 4 at a position corresponding to the chip. Optionally, the pressing cover 5 is arranged as an adjustable pressing cover, so that the pressing force applied to the chip by the pressing cover can be autonomously adjusted in the vertical direction in order to adapt to chips with different thicknesses and prevent the solder balls on the chip from being injured. On the one hand, the adjustable pressing cover 5 can fix chips with different thicknesses, and on the other hand, when a stress of the solder balls of the chip changes, the adjustable pressing cover can be adjusted along the vertical direction to avoid the problem that the solder balls are pressed to deform.

In an alternative embodiment, the plurality of adjustors 3 are respectively formed on four sidewalls of the fixing chamber 2 and symmetrically distributed in the two orthogonal directions within a horizontal plane. As shown in FIG. 1, the adjustors 3 are disposed on the carrier 1 at symmetrical positions along the X and Y directions. Thus, when the adjustors 3 fix the to-be-tested chip, the to-be-tested chip can be uniformly stressed, avoiding the deflection of the stress of the to-be-tested chip, so that the position of the to-be-tested chip will not be skewed. In FIG. 1, two adjustors 3 are respectively disposed in the X and Y directions. It should be noted that the purpose of fixing can be achieved by disposing one adjustor 3 in each direction and that stable positioning can be achieved by disposing more than two adjustors 3 in the X and Y directions. However, since dimensions of the to-be-tested chip in the X and Y directions are several times those of the adjustors 3, at this point, the positioning strategy adopting a plurality of adjustors 3 can enhance the stability of the to-be-tested chip fixed by the adjustors 3. The disposition of the adjustors 3 in the two orthogonal directions of the fixing chamber 2 has already achieved the technical effect of fixing the to-be-tested chip within the horizontal plane. In order to enable the to-be-tested chip to be uniformly stressed, the adjustors 3 are disposed in X-axis and Y-axis directions and opposite directions, and the plurality of adjustors 3 are respectively formed on the four side walls of the fixing chamber 2.

Figure 2:
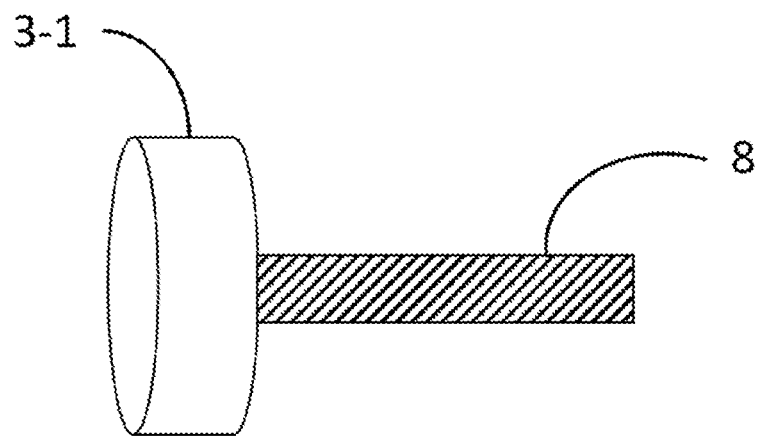
FIG. 2 is a schematic enlarged diagram of an adjustor in the fixing device shown in FIG. 1.

FIG. 2 is a schematic enlarged diagram of the adjustor in the fixing device shown in FIG. 1.

As shown in FIG. 2, in order to benefit the change of travels of the adjustors 3, each adjustor 3 includes an adjusting plate 3-1 and an adjusting knob 8, with the adjusting knob 8 disposed outside the carrier 1, and each adjusting plate 3-1 is extended or retracted for adjustment by means of the adjusting knob 8 connected thereto. Optionally, the adjusting knob 8 is of a threaded structure. In the process of rotation, travels of the adjusting knobs 8 are changed in the X and Y directions, so that the travels of the adjustors 3 are changed.

In an alternative embodiment, the adjustor 3 is made of a plastic polymer. Exemplarily, a diameter of the adjustor 3 is 3 mm to 5 mm, and a side thickness of the to-be-tested chip is generally about 1 mm to 3 mm, so the adjustors 3 can effectively clamp the to-be-tested chip.

In one embodiment, a brim of the fixing chamber 2 on the carrier 1 is provided with length scales. As shown in FIG. 1, the brim of the fixing chamber 2 is provided with graduations. Directions of the length scales are the same as the distribution directions of the adjustors 3, i.e., the X-axis and Y-axis directions in FIG. 1. A zero point of the X-axis and Y-axis directions is center coordinates of the fixing chamber 2.

Firstly, the graduations can visually indicate actual dimensions of the fixing chamber 2, so that maximum overall chip package dimensions which can be supported by the fixing device can be clearly marked out. More importantly, a quantitative reference is provided for the adjustment of the travels of the adjustor 3. For chips with equal overall package dimensions, the travels of the adjustors 3 are equal. It should be noted that the adjustors 3 fix the to-be-tested chip in two dimensions of the horizontal plane, so fixing directions may be orthogonal. The fixing chamber 2 and the adjustors 3 ensure that pins or solder balls of the to-be-tested chip are aligned with contact points of the test circuit in the horizontal plane.

Exemplarily, as shown in FIG. 1, the directions of the X axis and the Y axis are two orthogonal directions of the carrier 1 in the horizontal plane. Dimensions of the fixing chamber 2 are upper limits of dimensions of to-be-tested chips. That is, only when dimensions of a to-be-tested chip are less than those of the fixing chamber 2 can the to-be-tested chip be placed in the fixing chamber 2. Maximum travels of the adjustors 3 in the fixing chamber 2 define lower limits of dimensions of to-be-tested chips. That is, only when the lower limits of dimensions of a to-be-tested chip are greater than the dimensions of the fixing chamber 2 minus the maximum travels of the adjustors 3 can the to-be-tested chip be fixed in the fixing chamber 2. Therefore, the maximum travels of the fixing chamber 2 and the adjustors 3 depend on overall package dimensions of a chip required to be supported by the fixing device for chip test. For example, the overall package dimensions of the chip are (7-10)*(9-12) mm. If the fixing chamber 2 has a maximum dimension of, for example, 12 mm in the X direction and a maximum dimension of, for example, 14 mm in the Y direction, the two types of chips mentioned above can be fixed.

Exemplarily, when the upper limits and lower limits of the dimensions of the to-be-tested chip are within a range supported by the fixing device, the fixing device can be adjusted in the horizontal direction and the vertical direction to fix the to-be-tested chip.

During adjustment in the horizontal direction, adjusting travels of the adjustors 3 in the X and Y directions are first determined according to the overall package dimensions of the to-be-tested chip. Exemplarily, if the overall package dimensions of the chip are a*b, the maximum dimension of the fixing chamber 2 in the X direction is A and the maximum dimension of the fixing chamber 2 in the Y direction is B, then an overall adjusting travel of the adjustors 3 in the X direction is A-a and an overall adjusting travel of the adjustors 3 in the Y direction is B-b, Afterwards, the adjustors 3 are adjusted in the X and Y directions with reference to the length scales on the brim of the fixing chamber 2, so that the travels of the adjustors 3 respectively reach A-a and B-b.

It should be noted that the fixing chamber 2 has a symmetrical structure in the X and Y directions, so does the shape of the to-be-tested chip in the X and Y directions. In an alternative embodiment, the adjustors 3 are distributed on the four sidewalls of the fixing chamber 2, and are symmetrically distributed in the orthogonal directions in the horizontal plane. In a specific embodiment, as shown in FIG. 1, an equal number of adjustors 3 are disposed in every direction. Exemplarily, a distance between the adjusting plates of each two adjustors 3 in the X direction is, for example, 6 mm to 7 mm, and a distance between the adjusting plates of each two adjustors 3 in the Y direction is, for example, 7 mm to 8 mm. The adjustors 3 are symmetrically distributed in the orthogonal directions in the horizontal plane. In order to achieve the purpose that a center of the to-be-tested chip coincides with a center of the fixing chamber 2, the adjusting travels of the adjustors 3 in the X and Y directions and the X and Y opposite directions are set to be equal, that is, the adjusting travels of the adjustors 3 in the X direction toward the fixing chamber 2 are equal. Exemplarily, the travels of the adjustors 3 in the X direction is $(A-a)/2$, and the travels of the adjustors 3 in the Y direction is $(B-b)/2$. According to a symmetrical adjustment mode of such adjustors 3, the center of the chip coincides with the origin (the center of the fixing chamber 2) of the length scales.

During adjustment in the vertical direction, the top cover 4 is fixedly connected to the carrier 1. In an alternative embodiment, the pressing cover 5 is connected to the top cover 4 through screws. Referring to FIG. 1, the pressing cover 5 and the top cover 4 are fixedly connected in the vertical direction through screws. After the fixed connection, the pressing cover 5 generates a pre-tightening force on the to-be-tested chip through a spacer 6, so that the solder balls of the to-be-tested chip are in stable contact with the test circuit. Since the pressing cover 5 is an adjustable pressing cover, the pre-tightening force generated on the spacer 6 can change with an expansion stress of the solder balls. Optionally, when a plurality of pressing covers 5 are connected to the top cover 4, the plurality of pressing covers 5 have equal dimensions, so the spacers 6 under the plurality of pressing covers 5 are within a same horizontal plane. Therefore, every pressing cover 5 applies an equal pressure to the to-be-tested chip.

It should be noted that since the adjustors 3 are distributed in the two orthogonal directions in the horizontal direction and can be extended or retracted for adjustment along the orthogonal directions, the technical problem on how to fix the to-be-tested chip in the horizontal plane is solved; and since the adjustors 3 have the function of telescopic adjustment, chips with different overall package dimensions can be two-dimensionally fixed within the horizontal plane. The fixing of the to-be-tested chip in the vertical direction is implemented by arranging the pressing cover 5. Since the pressing cover 5 is an adjustable pressing cover, when the solder balls of the to-be-tested chip expand, the pressing cover 5 will be adjusted in the vertical direction, without increasing or decreasing the spacer number of the pressing cover to adapt to chips with different thicknesses, thus preventing the technical problem of deformation of the solder balls caused by excessive contact between the solder balls and the needles and omitting a complex test process. In addition, because the carrier 1 has no crossbeam structure, the pressing function of the pressing cover 5 on the chip will not be affected.

Figure 3:
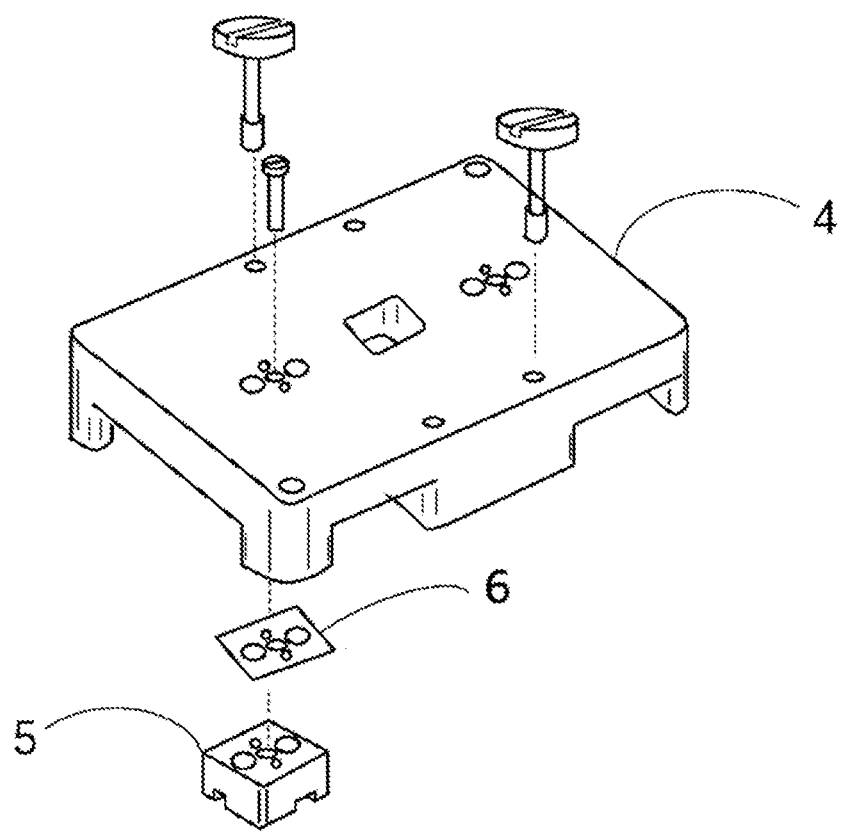
FIG. 3 is another schematic diagram of structures of a top cover and a pressing cover in the fixing device shown in FIG. 1.

FIG. 3 is another schematic diagram of structures of the top cover and the pressing cover in the fixing device shown in FIG. 1.

As shown in FIG. 3, in an alternative embodiment of the present application, each pressing cover 5 is provided with one or more movable spacers 6, and the position of the pressed chip in the vertical direction and the pressing force are adjusted by adjusting the number of the movable spacers 6. Therefore, chips with different thicknesses can be fixed by increasing or decreasing the number of the movable spacers 6. In addition, in some embodiments, the movable spacer 6 is formed as an elastic body, and the movable spacer 6 is compressed into different sizes when to-be-tested chips with different dimensions are fixed. The movable spacer 6 is compressed into different sizes according to the expansion stress of the solder balls of the to-be-tested chip.

Figure 4:
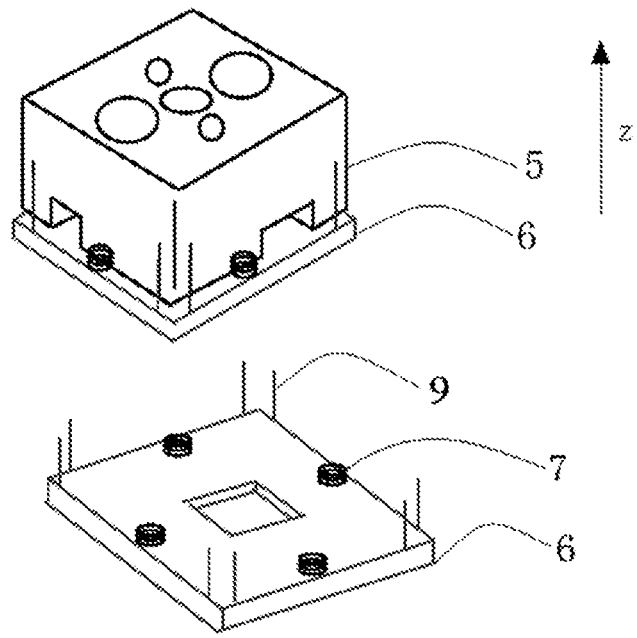
FIG. 4 is a schematic structural diagram of the pressing cover in the fixing device shown in FIG. 1.

FIG. 4 is a schematic structural diagram of the pressing cover in the fixing device shown in FIG. 1.

In an alternative embodiment, one or more spacers 6 are detachably connected to each pressing cover 5. The spacer 6 is between the pressing cover 5 and the to-be-tested chip, preventing stress from being concentrated on the to-be-tested chip by the pressing cover 5, so that the to-be-tested chip is uniformly stressed.

In another alternative embodiment of the present application, each pressing cover 5 is arranged as an elastic pressing cover, so that the pressing force applied to chips by the pressing cover 5 can be elastically adjusted autonomously. Optionally, for example, each pressing cover 5 is connected to the corresponding spacer 6 through a plurality of elastic bodies 7. Thus, when the pressing force is applied to chips in the vertical direction by the pressing cover 5, the elastic bodies 7 can be flexibly stretched or compressed according to the chips with different thicknesses and solder balls with different thermal expansion degrees on the chips, and thereby the pressing force applied to the chips can be autonomously adjusted. In the embodiments of the present application, the elastic body 7 is, for example, a spring, elastic rubber, silica gel or other materials. Exemplarily, an initial length of the elastic body 7 is L. After the to-be-tested chip is fixed, a pressure is generated between the elastic body 7 and the to-be-tested chip, and the length of the elastic body 7 is compressed to $L_1$. When the solder balls of the to-be-tested chip generate an expansion stress due to high temperature, the length of the elastic body 7 is compressed to $L_2$, wherein $L > L_1 > L_2$.

In an alternative embodiment, each pressing cover 5 is provided with a plurality of retaining grooves in the vertical direction, and each spacer 6 is provided with a plurality of pins 9 at positions corresponding to the retaining grooves, with each pin 9 inserted into the corresponding retaining groove on the pressing cover 5. Since the pins 9 on the spacer 6 are inserted into the retaining grooves on the pressing cover 5, when the elastic bodies 7 are stretched or compressed for adjustment in the vertical direction, the pins 9 limit the motion of the spacer in the horizontal direction. That is, the spacer 6 only moves in the vertical direction and cannot be skewed in the horizontal direction, and consequently, the spacer 6 will not be skewed due to a difference in elastic coefficients of the elastic bodies 7 or a non-uniform expansion stress of the solder balls. The pressing force of the pressing cover 5 can be vertically applied to the chip without deflection.

In an alternative embodiment, referring to FIG. 4, four corners of the pressing cover 5 are respectively provided with a retaining groove, and four corners of each spacer 6 are respectively provided with a pin 9 correspondingly. It should be noted that the pins at the four corners are in a symmetrical and parallel state, which better helps to counteract a torque in the horizontal direction, thus better preventing the skew of the spacer 6.

As shown in FIG. 4, the elastic bodies 7 are disposed between the pressing cover 5 and the spacer 6, and the pressing cover 5 is configured to fix the to-be-tested chip in the vertical direction, ensuring that the pins or solder balls of the to-be-tested chip are in good contact with the contact points of the test circuit in the vertical direction. The melting point of solder is 183° C., but an ambient temperature required by the high-temperature chip test even reaches 150° C. In this environment, solder balls of a BGA chip will produce an expansion stress. If the pressing cover 5 cannot adjust the fixed position in the vertical direction as the expansion stress is produced, then the to-be-tested chip will be forcibly squeezed to cause the deformation of the solder balls, thus affecting other tests of the chip. Therefore, according to the present embodiment, since the spacer 6 and the elastic bodies 7 are disposed under the pressing cover 5, the spacer 6 is in direct contact with the to-be-tested chip, so that a uniform pressure is applied to the to-be-tested chip, while the elastic bodies 7 can be automatically stretched or compressed for adjustment according to the expansion stress of the solder balls of the chip, that is, the elastic bodies 7 are compressed when the solder balls expand or stretched when the solder balls do not expand, thus preventing the solder balls from being squeezed to deform.

Figure 5:
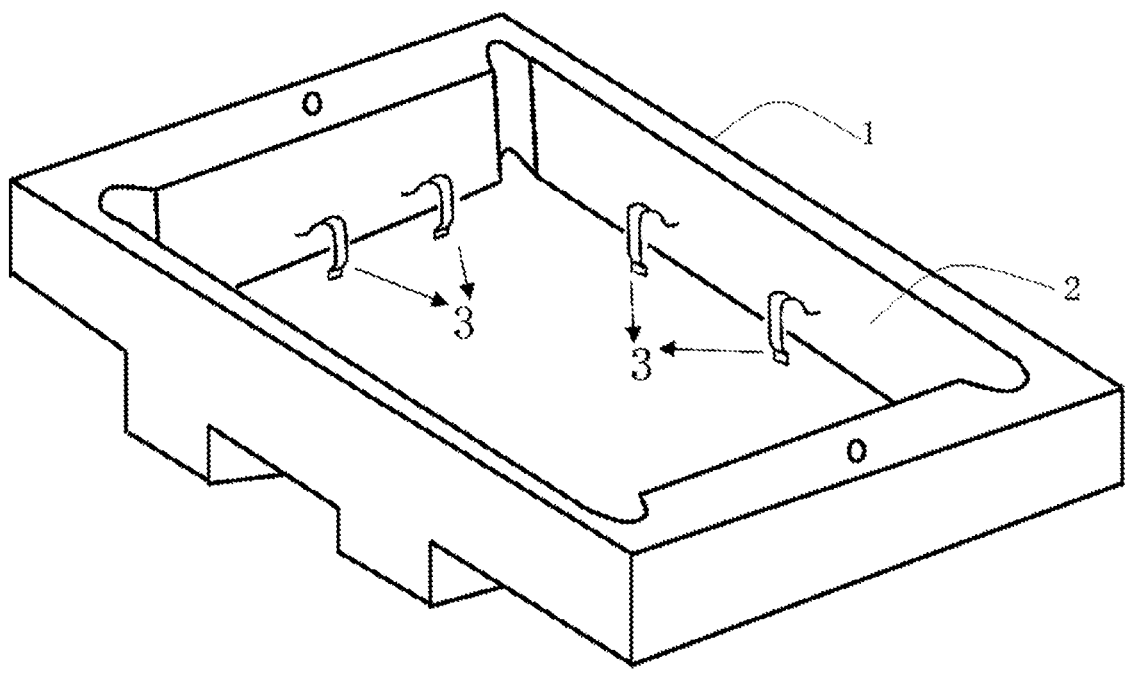
FIG. 5 is another schematic diagram of a carrier of the fixing device for chip test according to the embodiment of the present application.

FIG. 5 is another schematic diagram of the carrier of the fixing device for chip test according to the embodiment of the present application.

In an alternative embodiment, the adjustors 3 are elastic parts. As shown in FIG. 5, the adjustors 3 are spring strips. The advantages of the adjustors 3 as the spring strips is that the operation of manually adjusting the adjustors 3 is omitted, that is, the technical effect of fixing the to-be-tested chip can be achieved as long as the to-be-tested chip is put into the fixing chamber 2.

Figure 6:
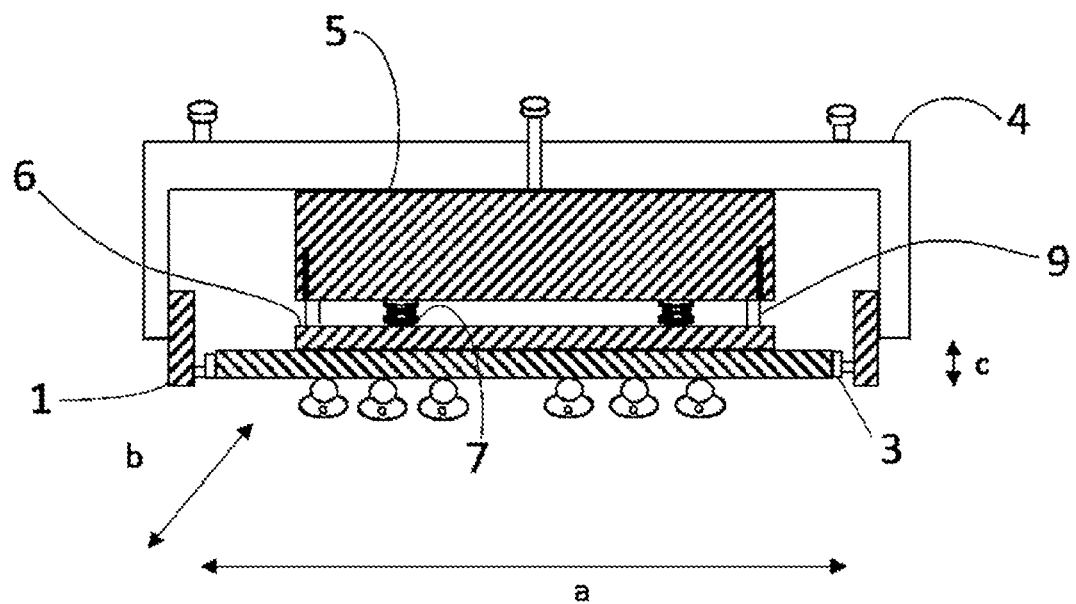
FIG. 6 is a schematic fixing diagram of the fixing device for chip test according to the specific embodiment of the present application.

FIG. 6 is a schematic fixing diagram of the fixing device for chip test according to the specific embodiment of the present application.

As shown in FIG. 6, in the present exemplary embodiment, dimensions of a to-be-tested chip 30 are a*b, and a thickness is c. In the carrier 1 in which the chip is fixed in the horizontal direction, the top cover 4 is connected to the pressing cover 5 in the vertical direction, the pressing cover 5 applies a pressure to the to-be-tested chip 30 through the elastic bodies 7 and the spacer 6, and solder balls of the to-be-tested chip 30 are in contact with the test circuit. The to-be-tested chip 30 is clamped by the adjustors 3, so that the to-be-tested chip 30 will not be moved or skewed. The pins 9 are inserted into the retaining grooves of the pressing cover 5, so that the spacer 6 is only translated in the vertical direction when moving in the vertical direction, without deflection. Through the cooperation between the carrier 1 and the top cover 4, the to-be-tested chip is accurately and reliably fixed in the horizontal direction and the vertical direction. In the horizontal direction, if dimensions of the to-be-tested chip are different, travels of the adjustors 3 are different. In the vertical direction, if the thickness of the chip is non-uniform, degrees of compression of the elastic bodies 7 are different, so are pre-tightening forces applied to the to-be-tested chip 30 by the elastic bodies 7. Therefore, within a range of compression capable of being borne by the elastic bodies 7, the present embodiment is suitable for fixing chips with different thicknesses.

Figure 7:
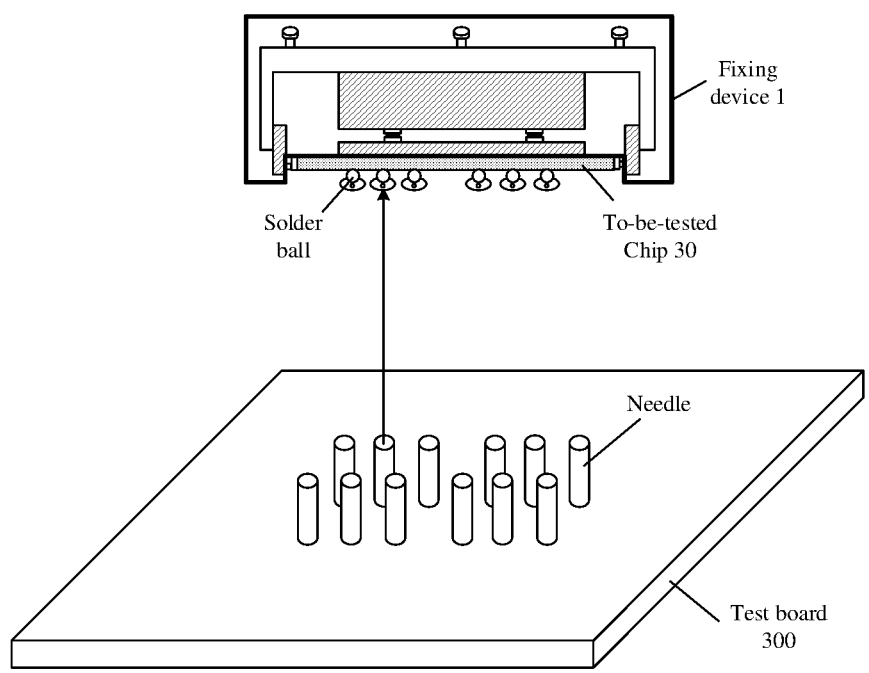
FIG. 7 is a schematic diagram of a chip tester according to an embodiment of the present application.

FIG. 7 is a schematic diagram of the chip tester according to the embodiment of the present application.

As shown in FIG. 7, the chip tester includes: a test board 300, a test circuit including needles being disposed on the test board 300; and the fixing device for chip test fixing the to-be-tested chip 30 on an upper surface of the test circuit, so that solder balls of the to-be-tested chip 30 are in contact with the needles.

The carrier 1 of the fixing device positions and fixes the to-be-tested chip in the horizontal direction. The pressing cover 5 of the fixing device is detachably fixed to the top cover 4 at a position corresponding to the chip. Optionally, the pressing cover 5 is arranged as an adjustable pressing cover, so that a pressing force applied to the chip by the pressing cover can be autonomously adjusted in the vertical direction in order to adapt to chips with different thicknesses and prevent the solder balls on the chip from being injured when the solder balls produce an expansion stress.

Figure 8:
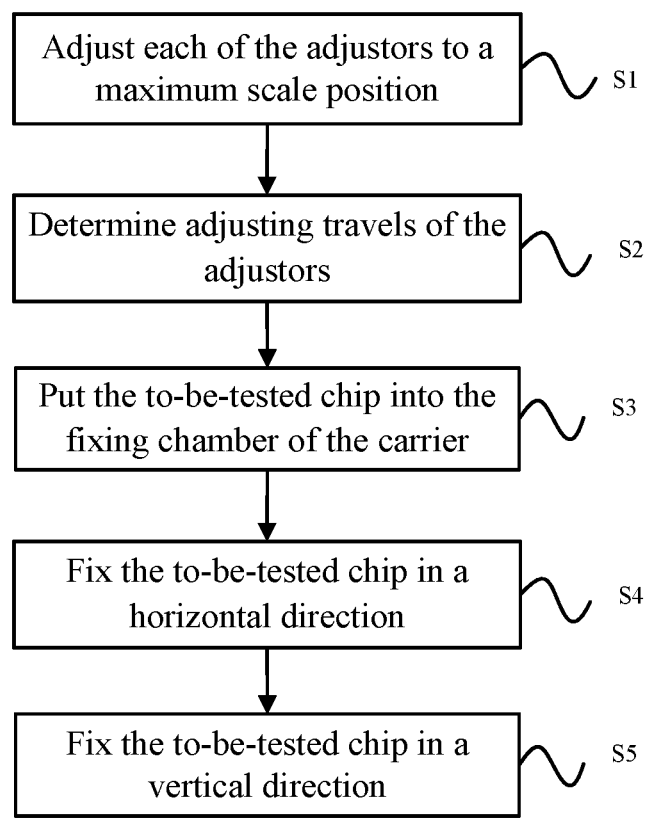
FIG. 8 is a schematic flow chart of a fixing method for chip test according to an embodiment of the present application.

FIG. 8 is a schematic flow chart of a fixing method for chip test according to an embodiment of the present application.

As shown in FIG. 8, an embodiment of the present application provides a fixing method for chip test, which uses the aforementioned fixing device for chip test. The steps of the fixing method for chip test according to the embodiment will be described in detail below.

(Step S1) adjusting each adjustor 3 to a maximum scale position.

The adjustors 3 are extended or retracted for adjustment to change scale positions. When the adjustors 3 reach the maximum scale positions, the fixing chamber 2 reaches a maximum spatial capacity. In a specific embodiment, the adjustors 3 are adjusted to a minimum travel in the fixing chamber 2, and at this point, the fixing chamber 2 reaches the maximum capacity which can be supported. In an alternative embodiment, the adjusting knobs 8 are rotated, so that the adjustors 3 reach the minimum travel. It should be noted that when the adjustors 3 are elastic parts, the fixing chamber 2 can reach the maximum spatial capacity as long as the elastic parts are compressed to the max.

(Step S2) determining adjusting travels of the adjustors 3 in the X and Y directions according to dimensions of a to-be-tested chip and scale information.

In an alternative embodiment, for example, if overall package dimensions of the chip is 9*10.5 mm and the fixing chamber 2 has a maximum dimension of 12 mm in the X direction and a maximum dimension of 14 mm in the Y direction, then an overall adjusting travel of the adjustors 3 in the X direction is 12 mm-9 mm=3 mm, and an overall adjusting travel of the adjustors 3 in the Y direction is 14 mm−10.5 mm=3.5 mm.

Optionally, when the adjustors 3 are disposed in both the X-axis and Y-axis directions and the X-axis and Y-axis opposite directions, the adjustors 3 are respectively adjusted by 1.5 mm in the X-axis direction and the X-axis opposite direction and by 1.75 mm in the Y-axis direction and the Y-axis opposite direction.

It should be noted that when the adjustors 3 are elastic parts, the elastic parts can be automatically stretched to fix the to-be-tested chip. In the horizontal plane, the adjustors 3 are used to fix chips with different overall package dimensions, and through the quantitative adjustment of the adjustors 3, the chips can be accurately fixed.

(Step S3) putting the to-be-tested chip into the fixing chamber 2 of the carrier 1.

Optionally, continuing with the alternative embodiment in S2, a central point of the to-be-tested chip is first aligned with a central point of the fixing chamber 2, that is, the central point of the to-be-tested chip is at a zero position of the length scales in the X and Y directions at the brim of the fixing chamber 2. In addition, edges of the to-be-tested chip are aligned with the scales, so as to ensure that the to-be-tested chip does not have an angle of rotation relative to the scales. The edges of the chip in the X direction are respectively aligned by a graduation of 4.5 mm, and the edges of the chip in the Y direction are respectively aligned by a graduation of 5.25 mm.

(Step S4) adjusting the adjustors 3 to predetermined positions according to the determined adjusting travels, so as to fix the to-be-tested chip in the horizontal direction.

Optionally, continuing with the alternative embodiment in S3, the adjustors 3 are respectively adjusted by 1.5 mm in the X-axis direction and the X-axis opposite direction and by 1.75 mm in the Y-axis direction and the Y-axis opposite direction.

(Step S5) placing the top cover 4 onto the carrier 1, so that the pressing cover 5 presses the to-be-tested chip to fix the to-be-tested chip in a vertical direction.

The top cover 4 is fixed onto the carrier 1, so that the pressing cover 5 presses the to-be-tested chip. In an alternative embodiment, the top cover 4 and the carrier 1 are connected using screws. Optionally, after the top cover 4 and the pressing cover 5 are connected using the screws, the elastic bodies 7 are in a compressed state, and under the action of an initial pre-tightening force of the elastic bodies 7, the to-be-tested chip is in a fixed state in the vertical direction, and solder balls of the chip are in good contact with the test circuit. The elastic bodies 7 can be automatically stretched or compressed for adjustment according to an expansion stress of the solder balls of the chip. Consequently, the to-be-tested chip is fixed in the vertical direction, and displacement in the vertical direction is adaptively adjusted with the expansion stress of the solder balls, preventing the technical problem that the test is affected by deformation of the solder balls caused by excessive contact between the solder balls and the needles in the vertical direction. Optionally, the pressing cover 5 is provided with a plurality of retaining grooves, and the spacer 6 is provided with a plurality of pins. The pins are inserted into the retaining grooves, so that the spacer 6 is only translated, that is, the pins limit the freedom of motion of the spacer 6 in any direction except the vertical direction. As shown in FIG. 4, since the pins of the spacer 6 are inserted into the retaining grooves of the pressing cover 5 and symmetrically distributed, when moving in the vertical direction, the spacer 6 cannot be skewed, and consequently, the spacer 6 will not be deflected due to a difference in elastic coefficients of the elastic bodies 7 or the non-uniform expansion stress of the solder balls.

It should be understood that the aforementioned specific embodiments of the present application are merely intended to illustrate or explain the principle of the present application rather than constitute a limitation to the present application. Therefore, any modification, equivalent substitution, improvement and the like made without departing from the spirit and scope of the present application shall be included in the protection scope of the present application. In addition, the appended claims of the present application are intended to cover all changes and modifications that fall within the scope and boundaries of the appended claims or equivalents of such scope and boundaries.

What is claimed is:

1. A fixing device for chip test, comprising:
   a carrier with a fixing chamber formed inside the carrier, the fixing chamber being configured for fixing a to-be-tested chip, a plurality of adjustors being disposed on sidewalls of the fixing chamber and configured to be extended or retracted to adjust a position of the to-be-tested chip in two orthogonal directions within a horizontal plane; and
   a top cover configured to cooperate with the carrier to fix the to-be-tested chip in a vertical direction;
   wherein at least one adjustable pressing cover is disposed at a lower end of the top cover, so as to autonomously adjust a pressing force applied to the to-be-tested chip by the at least one adjustable pressing cover in the vertical direction,
   wherein the plurality of adjustors is formed in at least one of following manners:
      each of the plurality of adjustors comprising a respective adjusting plate and a respective adjusting knob and the adjusting plate being extended or retracted for adjustment by means of the adjusting knob connected to the adjusting plate; or
      each of the plurality of adjustors being formed as an elastic part.

2. The fixing device for chip test of claim 1, wherein the plurality of adjustors are respectively formed on a plurality of sidewalls of the fixing chamber and symmetrically distributed in the two orthogonal directions within the horizontal plane.

3. The fixing device for chip test of claim 1, wherein the adjusting plate is made of a plastic polymer.

4. The fixing device for chip test of claim 1, wherein the plurality of adjustors are spring strips.

5. The fixing device for chip test of claim 1, wherein at least two sidewalls of the fixing chamber are provided with length scales, a scale zero of which is arranged as a center of a corresponding sidewall of the at least two sidewalls of the fixing chamber.

6. The fixing device for chip test of claim 1, wherein one or more spacers are detachably connected to each of the at least one adjustable pressing cover.

7. The fixing device for chip test of claim 6, wherein the one or more spacers are formed as elastic bodies.

8. The fixing device for chip test of claim 6, wherein the at least one adjustable pressing cover is formed as an elastic pressing cover, so as to elastically adjust the pressing force applied to the to-be-tested chip by the at least one adjustable pressing cover.

9. The fixing device for chip test of claim 8, wherein the elastic pressing cover is so formed that each of the at least one adjustable pressing cover is connected to a corresponding spacer of the one or more spacers through a plurality of elastic bodies.

10. The fixing device for chip test of claim 6, wherein each of the at least one adjustable pressing cover is provided with a plurality of retaining grooves in the vertical direction, each of the one or more spacers is provided with a plurality of pins at positions corresponding to the plurality of retaining grooves, and each of the plurality of pins is inserted into a corresponding retaining groove of the plurality of retaining grooves on the at least one adjustable pressing cover, so that the one or more spacers are only translated in the vertical direction.

11. The fixing device for chip test of claim 10, wherein four corners of each of the at least one adjustable pressing cover are respectively provided with a retaining groove of the plurality of retaining grooves, while four corners of each of the one or more spacers are respectively provided with a pin of the plurality of pins correspondingly.

12. The fixing device for chip test of claim 1, wherein the at least one adjustable pressing cover is connected to the top cover through screws.

13. A chip tester, comprising the fixing device for chip test of claim 1, comprising: a test board, a test circuit comprising needles being disposed on the test board; and the fixing device for chip test fixing the to-be-tested chip on an upper surface of the test circuit, so that solder balls of the to-be-tested chip are in contact with the needles.

14. A fixing method for chip test, using the fixing device for chip test of claim 1, comprising the following steps:
   (Step S1) adjusting each of the plurality of adjustors to a maximum scale position;
   (Step S2) determining adjusting travels of the plurality of adjustors in X and Y directions according to dimensions of the to-be-tested chip and scale information;
   (Step S3) putting the to-be-tested chip into the fixing chamber of the carrier;
   (Step S4) adjusting the plurality of adjustors to predetermined positions according to the determined adjusting travels, so as to fix the to-be-tested chip in a horizontal direction; and
   (Step S5) placing the top cover onto the carrier, so that the at least one adjustable pressing cover presses the to-be-tested chip to fix the to-be-tested chip in the vertical direction.

15. A fixing device for chip test, comprising:
   a carrier with a fixing chamber formed inside the carrier, the fixing chamber being configured for fixing a to-be-tested chip, a plurality of adjustors being disposed on sidewalls of the fixing chamber and configured to be extended or retracted to adjust a position of the to-be-tested chip in two orthogonal directions within a horizontal plane; and
   a top cover configured to cooperate with the carrier to fix the to-be-tested chip in a vertical direction;
   wherein at least one adjustable pressing cover is disposed at a lower end of the top cover, so as to autonomously adjust a pressing force applied to the to-be-tested chip by the at least one adjustable pressing cover in the vertical direction,
   wherein one or more spacers are detachably connected to each of the at least one adjustable pressing cover.

16. The fixing device for chip test of claim 15, wherein the plurality of adjustors are respectively formed on a plurality of sidewalls of the fixing chamber and symmetrically distributed in the two orthogonal directions within the horizontal plane.

17. The fixing device for chip test of claim 15, wherein the plurality of adjustors are spring strips.

18. The fixing device for chip test of claim 15, wherein at least two sidewalls of the fixing chamber are provided with length scales, a scale zero of which is arranged as a center of a corresponding sidewall of the at least two sidewalls of the fixing chamber.

19. The fixing device for chip test of claim 15, wherein the one or more spacers are formed as elastic bodies.

20. The fixing device for chip test of claim 15, wherein the at least one adjustable pressing cover is formed as an elastic pressing cover, so as to elastically adjust the pressing force applied to the to-be-tested chip by the at least one adjustable pressing cover.

\* \* \* \* \*